United States Patent [19]

Kal et al.

[11] Patent Number: 4,870,418
[45] Date of Patent: Sep. 26, 1989

[54] BIPOLAR INPUT CIRCUIT FOR CMOS FLASH ANALOG TO DIGITAL CONVERTER

[75] Inventors: Omer Kal, Istanbul, Turkey; John H. Hall, San Jose, Calif.

[73] Assignee: Linear Integrated Systems, Inc., Fremont, Calif.

[21] Appl. No.: 163,730

[22] Filed: Mar. 3, 1988

[51] Int. Cl.⁴ .............................................. H03M 1/00
[52] U.S. Cl. ..................................... 341/133; 341/172
[58] Field of Search ................................ 341/133, 172

[56] References Cited

U.S. PATENT DOCUMENTS 4,507,649  3/1985  Dingwall et al. .................... 341/172
4,641,130  2/1987  Mastroianni ......................... 341/172

Primary Examiner—William M. Shoop, Jr.
Assistant Examiner—Marc S. Hoff
Attorney, Agent, or Firm—David B. Harrison

[57] ABSTRACT

A CMOS analog to digital flash converter cell includes an input for receiving an analog signal to be converted to a digital value, a predetermined connection to a resistance ladder for providing a reference voltage, an output, CMOS comparator/inverter stage having drain connections commonly connected to the output, a level shift capacitor connected to input gate connections of the comparator/inverter stage, and three bi-phase clocked CMOS switches: a first switch for connecting the reference voltage to one side of the level shift capacitor during a first phase of a clock period; a second switch for connecting the output to the input gate connections on the other side of the level shift capacitor during the first phase of the clock period, and a third switch for connecting the input voltage to the one side of the level shift capacitor during a second phase of the clock period. The new input circuit includes a first bipolar transistor having a base connection to the predetermined resistance ladder connection and having an output node connected to the first CMOS switch and a second bipolar transistor having a base connection connected to the input and having an output node connected to the third CMOS switch.

5 Claims, 1 Drawing Sheet

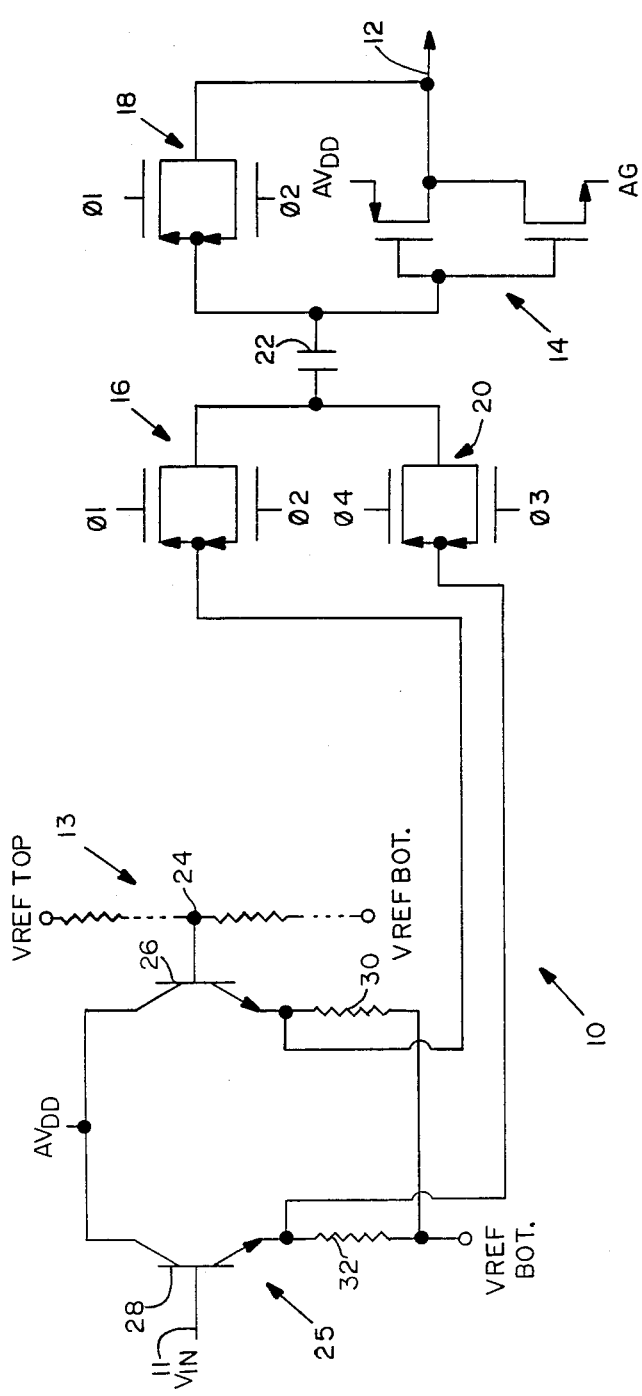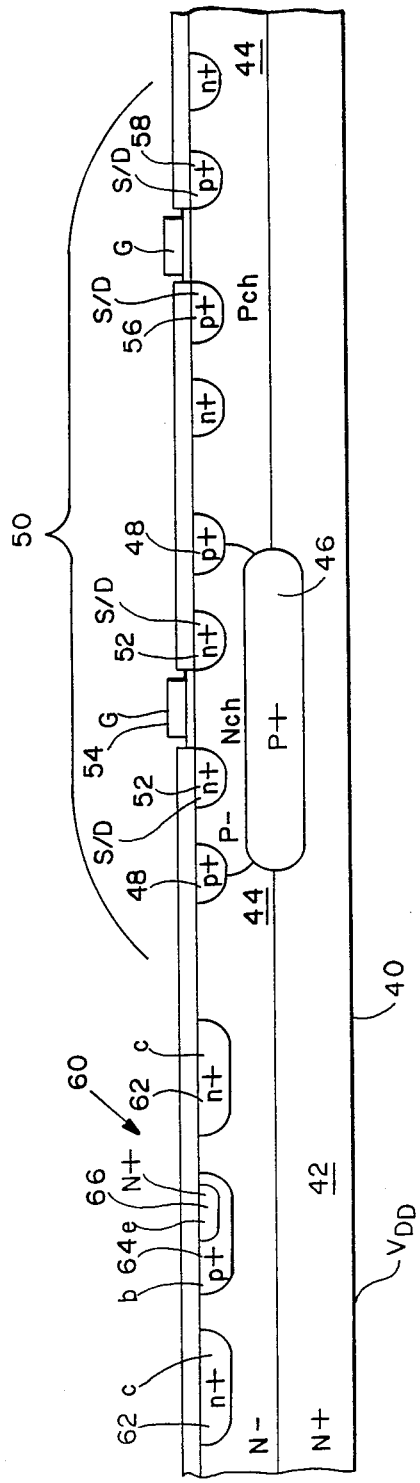

BIPOLAR INPUT CIRCUIT FOR CMOS FLASH ANALOG TO DIGITAL CONVERTER

FIELD OF THE INVENTION

The present invention relates to electrical circuitry. More particularly, the present invention relates to an input circuit for a complementary metal oxide semiconductor (CMOS) flash analog to digital (A/D) converter cell.

BACKGROUND OF THE INVENTION

High speed autozeroed, sequentially sampled, differential CMOS comparator cells have been developed, adapted and integrated into monolithic circuit arrays for use as high speed analog to digital converters. Such adaptation and use was proposed by Andrew G. F. Dingwall in an article entitled "Monolithic Expandable 6 Bit 20 MHz CMOS/SOS A/D Converter" appearing in IEEE Solid State Circuits, Vol SC-14, pp. 926–932, Dec. 1979.

While such circuit cells worked very well and represented a breakthrough, the limiting factor and drawback were loading errors attributable to the reference voltage resistor ladder. As explained in the article referenced above, "resistor ladder loading errors are of two types: (1) 'transient error' associated with instantaneous ladder loading during a single measurement and (2) long-term 'recovery error' associated with errors at a new input level after the ladder has been loaded for a long period by inputs at another level." This major source of loading error has resulted because of the current charging requirements of the large number of parallel level shift capacitors and related comparator stages required to carry out the flash conversion process. For eight bit resolution, 256 parallel comparator stages (cells) would be required. Also, this architecture has required that the input voltage have a very low impedance and be driven by a high slew rate amplifier due to the loading of the input stage.

Thus, a hitherto unsolved need has been for an improved input circuit for a CMOS flash A/D converter cell which overcame the aforementioned limitations and drawbacks.

SUMMARY OF THE INVENTION WITH OBJECTS

A general object of the present invention is to provide a voltage reference circuit for a CMOS flash A/D converter which overcomes the resistor ladder loading problems found in the prior art approaches.

A more specific object of the present invention is to provide a bipolar differential buffer input circuit for a CMOS flash A/D converter cell which may readily be incorporated within a monolithic integrated circuit without requiring additional process steps.

In accordance with the present invention, an input circuit for a CMOS analog to digital flash converter cell includes an input for receiving an analog signal to be converted to a digital value, a predetermined connection to a resistance ladder for providing a reference voltage, an output, CMOS comparator/inverter stage having drain connections commonly connected to the output, a level shift capacitor connected to input gate connections of the comparator/inverter stage, and three bi-phase clocked CMOS switches: a first switch for connecting the reference voltage to one side of the level shift capacitor during a first phase of a clock period; a second switch for connecting the output to the input gate connections on the other side of the level shift capacitor during the first phase of the clock period, and a third switch for connecting the input voltage to the one side of the level shift capacitor during a second phase of the clock period.

The new input circuit includes a first bipolar transistor having a base connection to the predetermined resistance ladder connection and having an output node connected to the first CMOS switch and a second bipolar transistor having a base connection connected to the input and having an output node connected to the third CMOS switch.

In one aspect of the present invention, the first and second bipolar transistors are formed as a single differential amplifier.

In another aspect of the present invention, the first and second bipolar transistors have common collectors and are configured as emitter followers, with the output node of each transistor being taken directly from the emitter and having an emitter resistor connected at each output node.

In a further aspect of the present invention the first and second bipolar transistors are NPN transistors having common collectors connected to a positive voltage rail and the emitter resistors are connected between the emitters and voltage reference bottom.

In yet another aspect of the present invention the CMOS analog to digital flash converter cell comprises one of N such cells of a converter formed on a single integrated circuit substrate wherein the quantization resolution of the converter is $2^N$ and wherein the first and second bipolar transistors for each said cell are formed directly on the substrate without additional circuit formation process steps being required during manufacture of the converter.

These and other objects, aspects, advantages and features of the present invention will be more fully understood and appreciated by considering the following detailed description of a preferred embodiment, presented in conjunction with the accompanying drawing.

BRIEF DESCRIPTION OF THE DRAWINGS

In the Drawings:

FIG. 1 is an electrical schematic circuit diagram of a voltage reference circuit element incorporating the principles of the present invention.

FIG. 2 is a greatly enlarged, quite diagrammatic sectional view of a CMOS integrated circuit which includes a bipolar buffer element in accordance with the principles of the present invention.

DETAILED DESCRIPTION OF A PREFERRED EMBODIMENT

A CMOS flash A/D converter circuit 10 incorporating a voltage reference circuit in accordance with the principles of the present invention is depicted schematically in FIG. 1 as including an input node 11, an output node 12 and a resistor ladder 13 extending across a positive voltage reference top potential Vreftop and a voltage reference bottom potential Vrefbot. The input node 11 is DC biased to at least the base-emitter voltage drop (VBE) over ground potential.

The circuit 10 includes a CMOS comparator inverter circuit 14, a first two-phase CMOS switch 16, a second two-phase CMOS switch 18 and a third two-phase CMOS switch 20. A level shift capacitor 22 interconnects the first and third switches 16 and 20 on one side and the second switch 18 and comparator 14 on the other. These elements 14, 16, 18, 20 and 22 are conventional and are as depicted in FIG. 3 of the above-referenced Dingwall article.

During the first half (phi 1 and phi 3) of a clocking pulse, the reference voltage was conventionally applied directly by the first switch 16 to charge the level shift capacitor 22. Also, during the first half of the pulse, the comparator 14 is simultaneously autozeroed to its toggle point by closure of the second switch 18 which effectively connects the gates of the comparator 14 to the output node 12. During the second half (phi 2 and phi 4) of the clocking pulse, the comparator 14 floats at its toggle point; and, the signal at the input node 11 was conventionally applied directly to the level shift capacitor 22 via the third switch 20. Any difference in potential between the reference potential and the input voltage shifts the base elements of the comparator 14 either above or below the toggle point. The amplified/inverted signal passing through the comparator inverter 14 is then put out at the output node 13 to a matched latch stage, resulting in a forced digital "higher" or "lower" decision at the trailing edge of the clocking pulse.

The reference voltage is taken from a predetermined tap 24 on the resistance ladder 13. The number of taps provided in the flash A/D converter is generally equal to the number of levels of quantization. In the overall architecture of the A/D converter, the applied input voltage is tested simultaneously by $2^N$ where N is the number of bits of resolution of the A/D converter. In practice, a CMOS analog to digital coverter is preferably formed on an integrated circuit substrate 40. The A/D converter comprises N converter cells 10 so that the quantization resolution of the converter is $2^N$. For example, in an 8 bit A/D flash converter, there would be 256 cells 10, each having its own comparator inverter stage 14. The outputs of the comparators 14 are digitally converted into a binary number representative of the instantaneous input voltage sampled and held in the voltage shift capacitor 22 during the second half (phi 2 and phi 4) of the clocking pulse.

In accordance with the principles of the present invention, a common collector, differential emitter follower buffer stage 25 is provided. This stage 25 includes two NPN bipolar transistors 26 and 28 in which the collectors thereof are commonly connected to the positive voltage rail AVdd. High value emitter resistors 30 and 32 enable the respective bases of the transistors 26 and 28 to look at much higher input impedances without any detriment. The differential configuration enables elimination of individual transistor $V_{BE}$ drop offset between Vin at the input node 11 and Vref at the reference node 24. Unlike the prior art approach, the input voltage Vin and the reference voltage Vref are currents which are amplified by the bipolar differential buffer stage 25. The current required to charge or discharge the level shift capacitor is now supplied directly from the positive rail AVdd and ground Ag via the collector-emitter paths of the differential transistors 26 and 28. The input current requirement at the bases of the transistors 26 and 28 is scaled down by a factor of each transistor's beta parameter, which is preferably fixed around 200. Since the gain of each emitter follower amplifier 26, 28 is unity, the "Miller effect", which is the effective increase in input capacitance by the magnitude of gain of the amplifier, is of no adverse effect. The only effective capacitance presented at the bases of the transistors 26, 28 is the collector to base capacitance which is a very small, effectively negligible amount of additional capacitance. Thus, the bandwidth at the input node 11 is increased considerably, reducing the input drive requirements, and the loading of the resistor ladder 13, heretofore a major source of conversion inaccuracy in flash converters, has been virtually eliminated. Other bipolar amplifier configurations may be employed with a gain in excess of unity and provide improved low frequency conversion performance.

Advantageously, as seen in FIG. 2, the formation of bipolar transistors having a common collector configuration connected directly to the positive voltage rail AVdd may be carried out within a conventional CMOS fabrication process without addition of any additional or special process steps.

In FIG. 2 a silicon substrate 40 includes an N+ bulk layer 42 and an N− epitaxial layer 44 grown upon the crystalline substrate 40. A P+ well 46 and guard ring 48 surround a conventional N channel FET of a CMOS cell 50, having source/drain regions 52 separated by an insulated gate 54 while the P channel FET thereof having an N+ guard ring 55 and source drain regions 56 separated by an insulated gate 58 is formed directly in the epitaxial layer 44. With the present invention, a bipolar transistor 60 may easily be formed by forming an N+ collector ring 62 and a P+ base region 64 in the top of the epitaxial layer 44. An N+ emitter well 66 is then formed within the P+ base region 64 as shown in FIG. 2.

To those skilled in the art to which the present invention pertains, many widely differing embodiments and applications will be suggested from the foregoing without departure from the scope of the present invention which is more particularly set forth in the following claims:

We claim:

1. An input circuit for a CMOS analog to digital flash converter cell which includes an input for receiving an analog signal to be converted to a digital value, a predetermined connection to resistance ladder means for providing a reference voltage, an output, CMOS comparator/inverter means having drain connections commonly connected to the output, a level shift capacitor connected to input gate connections of the comparator/inverter means, and three bi-phase clocked CMOS switch means: a first switch means for connecting the reference voltage to one side of the level shift capacitor during a first phase of a clock period; a second switch means for connecting the output to the input gate connections on the other side of the level shift capacitor during the first phase of the clock period, and a third switch means for connecting the input voltage to the one side of the level shift capacitor during a second phase of the clock period, the input circuit comprising:
   first bipolar transistor means having a base connection to the predetermined resistance ladder connection and having an output node connected to the first CMOS switch means; and
   second bipolar transistor means having a base connection connected to the input and having an output node connected to the third CMOS switch means.

2. The input circuit set forth in claim 1 wherein said first and second bipolar transistor means are formed as a single differential amplifier.

3. The input circuit set forth in claim 2 wherein said first and second bipolar transistor means have common collectors and are configured as emitter followers, with the output node of each transistor means being taken directly from the emitter and having an emitter resistor connected at each output node.

4. The input circuit set forth in claim 3 wherein said first and second bipolar transistor means are NPN transistors having common collectors connected to a positive voltage rail and wherein the emitter resistors are connected between the emitters and ground.

5. A CMOS analog to digital flash converter comprising N conversion cells formed on an integrated circuit substrate wherein the quantization resolution of the converter is $2^N$, each cell comprising:

an input circuit for receiving an analog signal to be converted to a digital value, a predetermined connection to resistance ladder means for providing a reference voltage, an output, CMOS comparator/inverter means having drain connections commonly connected to the output, a level shift capacitor connected to input gate connections of the comparator/inverter means, and three bi-phase clocked CMOS switch means: a first CMOS switch means for connecting the reference voltage to one side of the level shift capacitor during a first phase of a clock period; a CMOS second switch means for connecting the output to the input gate connections on the other side of the level shift capacitor during the first phase of the clock period; and, a third CMOS switch means for connecting the input voltage to the one side of the level shift capacitor during a second phase of the clock period, each input circuit of each cell comprising:

first bipolar transistor means formed on the substrate and having a base connection to the predetermined resistance ladder connection and having an output node connected to the first CMOS switch means; and second bipolar transistor means formed on the substrate having a base connection connected to an input and having an output node connected to the third CMOS switch means.

\* \* \* \* \*